US010175906B2

(12) United States Patent
Muralimanohar et al.

(10) Patent No.: US 10,175,906 B2
(45) Date of Patent: Jan. 8, 2019

(54) ENCODING DATA WITHIN A CROSSBAR MEMORY ARRAY (71) Applicant: Hewlett Packard Enterprise Development LP, Houston, TX (US)

(72) Inventors: Naveen Muralimanohar, Santa Clara, CA (US); Erik Ordentlich, San Jose, CA (US); Cong Xu, Palo Alto, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 12 days.

(21) Appl. No.: 15/325,118

(22) PCT Filed: Jul. 31, 2014

(86) PCT No.: PCT/US2014/049205
§ 371 (c)(1),
(2) Date: Jan. 10, 2017

(87) PCT Pub. No.: WO2016/018386
PCT Pub. Date: Feb. 4, 2016

(65) Prior Publication Data
US 2017/0192711 A1  Jul. 6, 2017

(51) Int. Cl.
G06F 12/00  (2006.01)
G06F 3/06  (2006.01)
(Continued)

(52) U.S. Cl.
CPC .......... G06F 3/0638 (2013.01); G06F 3/0604 (2013.01); G06F 3/0679 (2013.01);
(Continued)

(58) Field of Classification Search
CPC ...... G06F 3/061; G06F 3/0655; G06F 3/0679; G06F 3/0688
See application file for complete search history.

(56) References Cited

U.S. PATENT DOCUMENTS 7,218,570 B2 * 5/2007 So ........................ G11C 5/063
365/189.09
7,573,775 B2  8/2009 Fallah et al.
(Continued)

FOREIGN PATENT DOCUMENTS

WO  WO-2008048597 A2  4/2008
WO  WO-2011112201 A1  9/2011
WO  WO-2013046217 A2  4/2013

OTHER PUBLICATIONS

Cassuto, Y. et al., Sneak-Path Constraints in Memristor Crossbar Arrays, Retrieved on Jul. 18, 2014, 5 Pgs.
(Continued)

Primary Examiner — David Yi
Assistant Examiner — Tahilba O Puche
(74) Attorney, Agent, or Firm — Mannava & Kang, P.C.

(57) ABSTRACT

In an example, in a method for encoding data within a crossbar memory array containing cells, bits of input data may be received. The received bits of data may be mapped to the cells in a row of the memory array, in which the cells are to be assigned to one of a low resistance state and a high resistance state. A subset of the mapped bits in the row may be grouped into a word pattern. The word pattern may be arranged such that more low resistance states are mapped to cells that are located closer to a voltage source of the row of the memory array than to cells that are located farther away from the voltage source.

15 Claims, 6 Drawing Sheets (51) Int. Cl.
  *G11C 7/10* (2006.01)
  *G11C 13/00* (2006.01)
(52) U.S. Cl.
  CPC ........ *G11C 7/1012* (2013.01); *G11C 13/0069* (2013.01); *G11C 2213/77* (2013.01)

(56) References Cited

U.S. PATENT DOCUMENTS

| | | | |
|---|---|---|---|
| 8,619,457 B2 | 12/2013 | Lee | |
| 8,700,885 B2* | 4/2014 | Sakamaki | G06F 13/4013 710/3 |
| 2005/0055387 A1 | 3/2005 | Kuekes et al. | |
| 2006/0168505 A1* | 7/2006 | Liaw | G11C 13/0011 714/823 |
| 2009/0003040 A1 | 1/2009 | Stan et al. | |
| 2010/0138635 A1 | 6/2010 | Noyes | |
| 2010/0321977 A1* | 12/2010 | Sekar | G11C 7/00 365/148 |
| 2013/0044011 A1 | 2/2013 | Ordentlich et al. | |
| 2013/0097396 A1* | 4/2013 | Ordentlich | G11C 7/1006 711/154 |
| 2013/0326201 A1 | 12/2013 | Gopal et al. | |
| 2014/0019506 A1 | 1/2014 | Kuo | |
| 2014/0108891 A1 | 4/2014 | Strasser et al. | |
| 2014/0112055 A1* | 4/2014 | Kawahara | G11C 13/00 365/148 |

OTHER PUBLICATIONS

International Searching Authority, The International Search Report and the Written Opinion, PCT/US2014/049205, dated Mar. 11, 2015, 10 Pages.

\* cited by examiner

ENCODING DATA WITHIN A CROSSBAR MEMORY ARRAY

STATEMENT OF GOVERNMENT RIGHTS

This invention was made with Government support under Contract No. DE-SC0005026 awarded by the Department of Energy. The Government has certain rights in this invention.

BACKGROUND

Electronic data is typically represented using a binary number system. The binary number system is one in which values may take on one of two states, typically represented by a logical "1" and a "0". Various types of memory systems have been developed, which include small programmable devices that store a single bit as either a logical "1" or a "0". The ON state may be used to represent a logical "1," while the OFF state may be used to represent a logical "0". One type of memory architecture is the crossbar memory architecture. The crossbar memory architecture includes two sets of interconnecting conductor segments and memory elements are placed at multiple crosspoints between the interconnecting conductor segments.

BRIEF DESCRIPTION OF THE DRAWINGS

Features of the present disclosure are illustrated by way of example and not limited in the following figure(s), in which like numerals indicate like elements, in which.

DETAILED DESCRIPTION

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

1. Overview

Disclosed herein are examples of methods for encoding bits of input data within a crossbar memory array containing a plurality of cells. The disclosed methods, for instance, may be implemented to improve a switching speed of a selected cell and minimize a voltage drop for current flowing through a wordline of a half-selected cell of the crossbar memory array due to sneak or leakage current. Also disclosed herein are a data storage system for implementing the methods and a non-transitory computer readable medium on which is stored machine readable instructions that implement the methods.

According to an example of a disclosed method, bits of data (e.g., a string of bits) may be received by a memory control module for input into respective cells of the memory array. The bits may be mapped to the cells in a row of the memory array, in which the cells are to be assigned to one of a low resistance state and a high resistance state according to the mapping. A subset of the mapped bits in the row may be grouped into a word pattern. According to an example, the word pattern may be arranged such that more low resistance states are assigned to cells that are located closer to a voltage source of the row of the memory array than to cells that are located farther away from the voltage source. As discussed in greater detail herein, this arrangement enables the bits of input data to be stored into corresponding cells of the memory array in a manner that may generally improve a switching speed of a selected cell and minimize a voltage drop for current flowing through the row of a half-selected cell of the memory array due to sneak or leakage current.

According to additional examples, the word pattern may be arranged by flipping the word pattern according to one of a big endian arrangement and a little endian arrangement. An additional bit, for instance, may be stored in the memory array to indicate whether the word pattern is stored in the big endian arrangement or the little endian arrangement. This additional bit may also, for example, be stored close to the voltage source to further minimize the effective voltage drop across the row. In this regard, the word pattern may be decoded by reverting the word pattern to its original form based on the stored additional bit.

According to an example, the cells of the memory array may be memory elements such as memristors. Memristors are devices whose resistances change in response to various programming conditions. For instance, memristors may be programmed to represent a logical "1" or ON while in a low resistance state and a logical "0" or OFF while in a high resistance state.

According to an example, the cells may be arranged in the crossbar memory array to improve density and reduce cost. For example, a crossbar memory array may include a plurality of cells in each row (i.e., wordline) and column (i.e., bitline) of the crossbar memory array. In order to program or read the value of the cell, a respective write or read voltage may be applied to the cell through the respective row and column conductors of the selected cell. However, other cells connected to the same row and column conductors of the selected cell may experience a voltage drop across their terminals and may thus be considered half-selected. For instance, when a cell is accessed to perform a read or a write, all of the half-selected cells in the selected row and column may have sneak or leakage current flowing through them. This sneak or leakage current not only increases energy consumption, it also reduces the effective read or write voltage across the selected cell due to voltage drop along the row or column. This, in turn, may reduce switching speed since the switching speed of the selected cell is an increasing function of voltage drop across the selected cell.

The number of cells placed in a low resistance state may also impact the performance of the memory by contributing to the cumulative current draw. The impact of sneak or leakage current on a read or a write to a selected cell is a function of the selected cell's distance from a voltage source (i.e., driver) in a memory crossbar. In this regard, for instance, the reduced voltage is more severe if the half-selected cell's leakage or sneak path is longer.

According to an example, the disclosed examples provide an encoding scheme to minimize the voltage drop due to sneak or leakage current. Generally speaking, the encoding scheme disclosed herein may effectively lead to improved access latency, energy, and memory performance. The increased memory performance of the disclosed examples may include a reduction in the cumulative current draw, which may provide for reduced power consumption and increased accuracy in determination of the state of a selected cell in the crossbar memory array. Reduction in the cumulative current draw may also lead to reduction in parasitic loss due to sneak or leakage current, which may enable an increase in a crossbar memory array size.

2. Hardware and Structure

Figure 1:
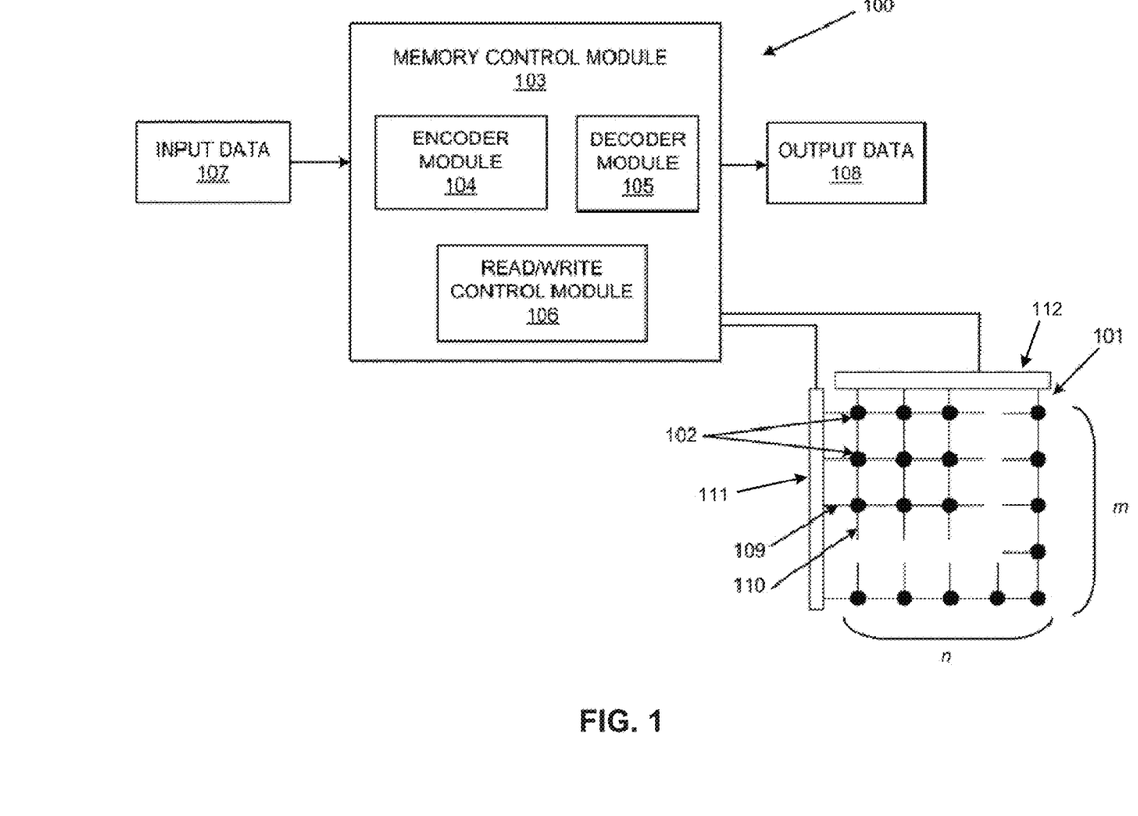
FIG. 1 shows a schematic view of a data storage apparatus, according to an example of the present disclosure.

FIG. 1 illustrates a schematic view of a data storage apparatus 100 that includes a memory control module 103, according to an example. The memory control module 103 may control operations of storing and retrieving data to and from an m×n memory array 101 of cells 102, which may be memristor devices, memristors, etc. The apparatus 100 is depicted as including an encoder module 104 that is to encode data and a decoder module 105 that is to decode data. The apparatus 100 is further depicted as including a read/write control module 106 that is to control operations of reading data from the memory array 101 and writing data to the memory array 101. The memory control module 103 may encode input data 107 and store the encoded data into the memory array 101. The memory control module 103 may also read out the encoded data stored in the memory array 101, decode the data to recover the original bits in the input data 107, and transmit the decoded data as output data 108.

According to an example, the memory array 101 is part of the apparatus 100. In another example, the memory array 101 is separate from the apparatus 100. In any regard, the m×n memory array 101 may respectively include first and second sets of m and n conductors, e.g., wires. Each of the m conductors in the first set may cross each of the n conductors in the second set to address one of the cells 102 located at the crossing point. In order to facilitate a description of the memory array 101, the conductors in the first and second sets may be respectively referred to as rows (i.e., wordlines) and columns (i.e., bitlines) of the memory array 101. The m×n memory array 101 may include m row conductors 109 and n column conductors 110 in a circuit plane. The crosspoints of the row conductors 109 and the column conductors 110 may form a total of m×n cells. The reading and writing of individual bits of data to the cells 102 involves the application of voltages by row drivers 111 and column drivers 112. The conductors 109, 110 and cells 102 may be formed in different circuit planes. Moreover, the conductors 109, 110 may be formed of a variety of shapes as needed or desired, and may likewise form a grid of a variety of shapes.

Figure 2:
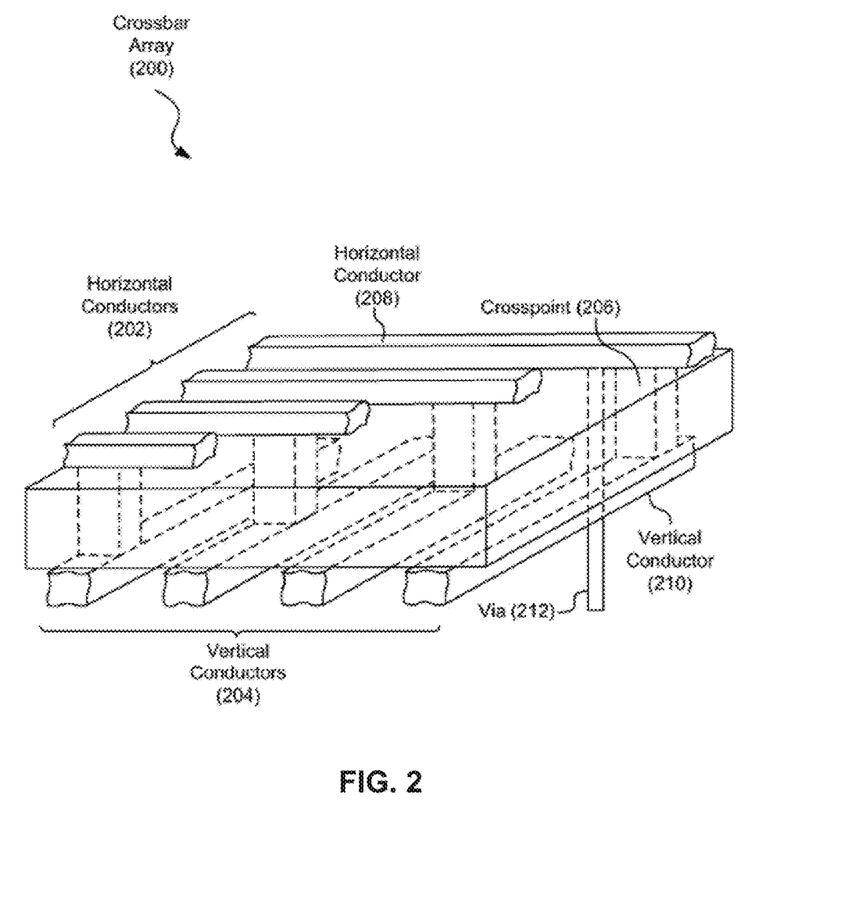
FIG. 2 shows a diagram of a crossbar memory array, according to an example of the present disclosure.

FIG. 2 is a diagram showing a crossbar memory array 200 according to an example of the present disclosure. According to an example, the crossbar memory array 200 includes a set of horizontal conductors 202, which are depicted as being generally in parallel with respect to each other. Additionally, a set of vertical conductors 204 is depicted as being generally perpendicular to, and crossing, the horizontal conductors 202. Programmable cells 102 are further depicted as being placed at the crosspoints 206 between a horizontal conductor 208 and a vertical conductor 210.

As discussed above, the cells 102 may be memristors or equivalently, memristor devices. Memristors exhibit a "memory" of past electrical conditions. For example, a memristor may include a matrix material that contains mobile dopants that may be moved within the matrix material to dynamically alter the electrical operation of the memristor.

The motion of dopants may be induced by the application of a programming condition such as an applied electrical voltage across the memristive matrix material. Particularly, the programming voltage generates a relatively high electrical field through the memristive matrix material and alters the distribution of dopants. After removal of the electrical field, the location and characteristics of the dopants remain stable until the application of another programming electrical field. For example, by changing the dopant configurations within the memristive matrix material, the electrical resistance of the memristor may be altered. The state of the memristor may be read by applying a lower reading voltage across the memristive matrix material which allows the internal electrical resistance of the memristor to be sensed but does not generate a sufficiently high electrical field to cause significant dopant motion. Consequently, the state of the memristor may remain stable over long time periods and through multiple read cycles.

According to an example, the crossbar memory array 200 may be used to form a non-volatile memory array. In this example, each of the cells at the crosspoints 206 may be used to represent a bit of data. Although individual conductors 208, 210 in FIG. 2 are shown with rectangular cross sections, the crossbar memory array 200 may also have square, circular, elliptical, or more complex cross sections. The conductors may also have many different widths, diameters, aspect ratios and/or eccentricities. The crossbars may be nanowires, sub-microscale wires, microscale wires, or wires with larger dimensions.

According to various examples, the crossbar memory array 200 may be integrated into a Complimentary Metal-Oxide-Semiconductor (CMOS) circuit or other conventional computer circuitry. Each individual conductor may be connected to the CMOS circuitry by a via 212. The via 212 may be an electrically conductive path through the various substrate materials used in manufacturing the crossbar architecture. This CMOS circuitry may provide additional functionality to the memristor such as input/output functions, buffering, logic, configuration, or other functionality. Multiple crossbar memory arrays may be formed over the CMOS circuitry to create a multilayer circuit.

3. Examples of the Encoding Process

Figure 3:
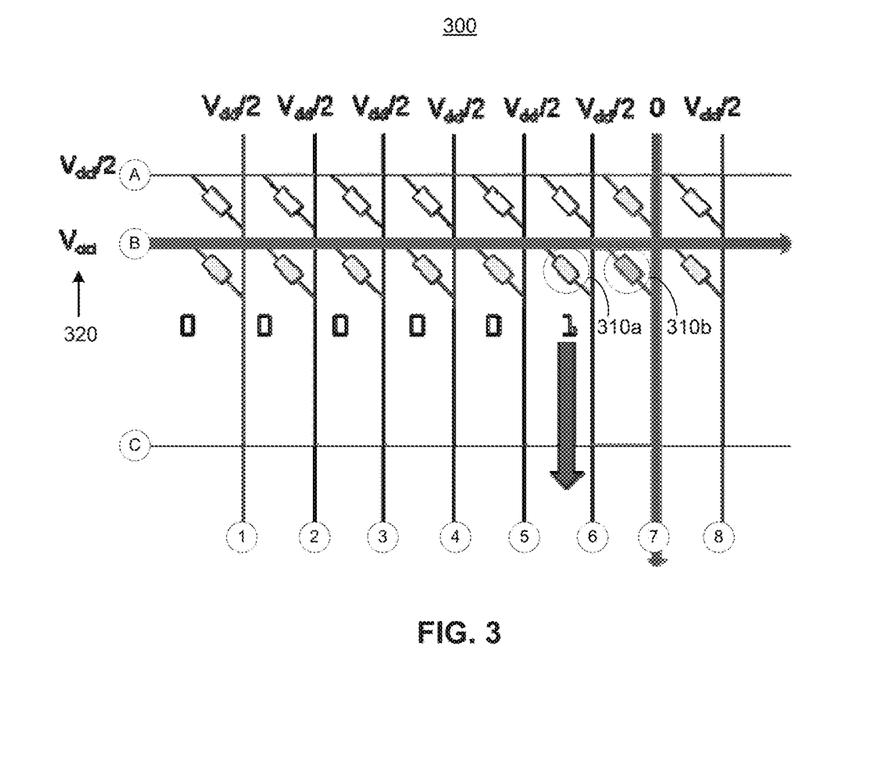
FIG. 3 shows a crossbar memory array with a low resistance state mapped to a cell that is located far from a voltage source, according to an example of the present disclosure.

With reference to FIG. 3, there is shown an example of a crossbar memory array 300 with a low resistance state mapped to a cell 310a, which is located far from a voltage source 320. In this example, a number of bits of input data 107 (FIG. 1) are mapped to cells located at the crosspoints of row B and columns 1-6 of the memory array 300. For example, row B and columns 1-6 are mapped according to a bit pattern of '000001'. As such, a low resistance state is initially mapped to cell 310a at the crosspoint of row B and column 6.

In the example of FIG. 3, the read/write control module 106 (FIG. 1) may attempt to access selected cell 310b located at the crosspoint of row B and column 7. In this regard, for instance, all of the cells located in row B and column 7 are half-selected cells. As mentioned above, the sneak or leakage current through a half-selected cell is a function of the cell's resistance. In other words, a half-selected cell with a low resistance state (i.e., logical "1" or ON) may have more leakage than a half-selected cell with a high resistance state (i.e., logical "0" or OFF). Moreover, the location of a half-selected cell with a low resistance state in relation to the voltage source 320 may significantly impact the access time and voltage drop in the half-selected row.

In one regard, when the read/write control module 106 attempts to access selected cell 310*b*, the half-selected cell 310*a* has the highest leakage current due to its low resistance state. That is, mapping the logical "1" farther away from the voltage source (i.e., driver) 320 may lead to a large sneak or leakage current flowing all the way from the voltage source 320 to the half-selected cell 310*a* with the low resistance state. This may result in large voltage drop along the conductor in row B that connects the voltage source 320 to the half-selected cell 310*a*.

Figure 4:
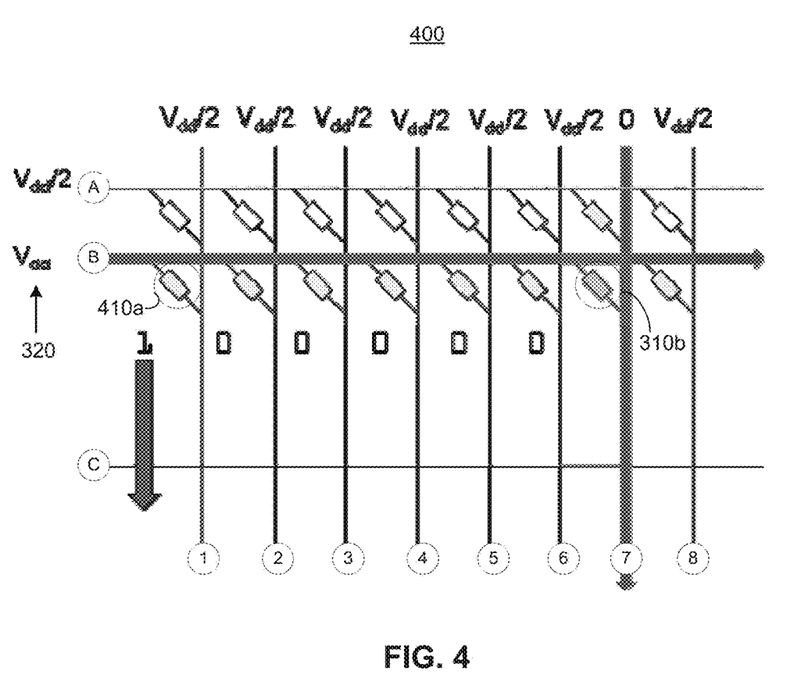
FIG. 4 shows a crossbar memory array with a low resistance state mapped to a cell that is located closer to a voltage source, according to an example of the present disclosure.

With reference to FIG. 4, there is shown an example of a crossbar memory array 400 with a low resistance state mapped to cell 410*a*, which is located closer to the voltage source 320 than the cell 310*a* (FIG. 3). In this example, in order to minimize the voltage drop along the conductor in row B, the encoder module 104 may arrange the bit pattern such that the low resistance state is mapped to a half-selected cell 410*a* that is located closer to the voltage source 320.

According to this example, the encoder module 104 may group a subset of the cells from row B into a word pattern, also referred herein as a bit pattern. The word pattern, for instance, may include the subset of cells located in columns 1-6 of row B in the memory array, which has the bit pattern of '000001'. The encoder module 104, however, is not limited to grouping all of the contiguous cells in a row or a portion of the contiguous cells in a row as the subset of cells, and may group non-contiguous cells as the subset of cells according to any predetermined grouping algorithm.

The encoder module 104 may then determine if a majority of low resistance states in the word pattern are mapped to cells that are located farthest from a voltage source 320. In this example, the word pattern of '000001' has a majority of low resistance states in the half of the word pattern that is farthest away from the voltage source 320. In other words, the half of the word pattern that is closest to the voltage source 320 does not have any low resistance states while the half of the word pattern that is farthest away from the voltage source 320 has one low resistance state, and hence, the majority of low resistance states for the word pattern.

In response to the majority of low resistance states in the word pattern being located farthest from a voltage source 320, the encoder module 104 may arrange the word pattern such that a more low resistance states are mapped to cells that are located closer to the voltage source 320 of the row of the memory array. Specifically, as shown in FIG. 4, the encoder module 104 may flip the word pattern from '000001' to '100000' and store the flipped word pattern into the corresponding cells in row B of the memory array 400. By flipping the word pattern, the effective voltage drop across row B may be minimized because the majority of low resistance states are located closer to the voltage source of the row of the memory array. That is, mapping the logical "1" close to the voltage source 320 may lead to a smaller sneak or leakage current flowing from the voltage source 320 to the half-selected cell 410*a* with the low resistance state. This may result in a minimized voltage drop along the conductor in row B that connects the voltage source 320 to the half-selected cell 410*a*.

According to an example, the word pattern may be flipped to one of a big endian arrangement and a little endian arrangement. For example, one arrangement may indicate an original order for the word pattern and the other arrangement may indicate that the order for the word pattern has been flipped. In addition, an additional bit in the memory array 400 may be stored to indicate whether the word pattern is stored in the big endian arrangement or the little endian arrangement. This additional bit may also, for example, be stored close to the voltage source. Thus, in this regard, the decoder module 105 may later decode the word pattern by reverting the word pattern to its original form of '000001' based on the stored additional bit, which indicates whether the word pattern is stored in the original order or the flipped order to minimize the effective voltage drop across row B.

4. Method

Figure 5:
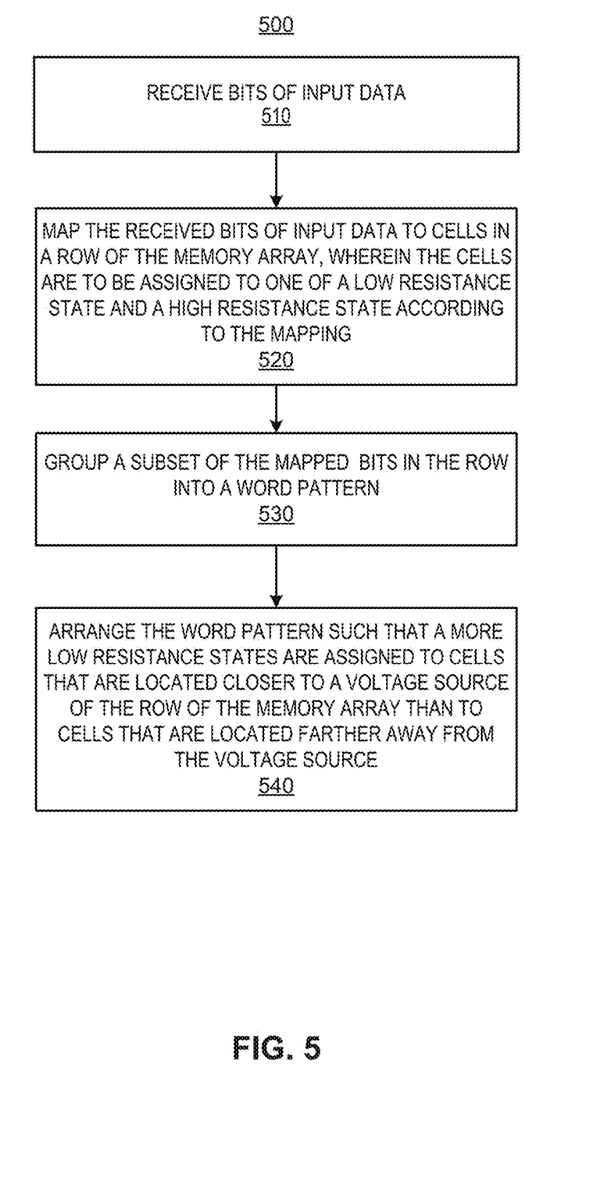
FIG. 5 shows a flow chart of a method for encoding input data for storage in a crossbar memory array, according to an example of the present disclosure.
Figure 6:
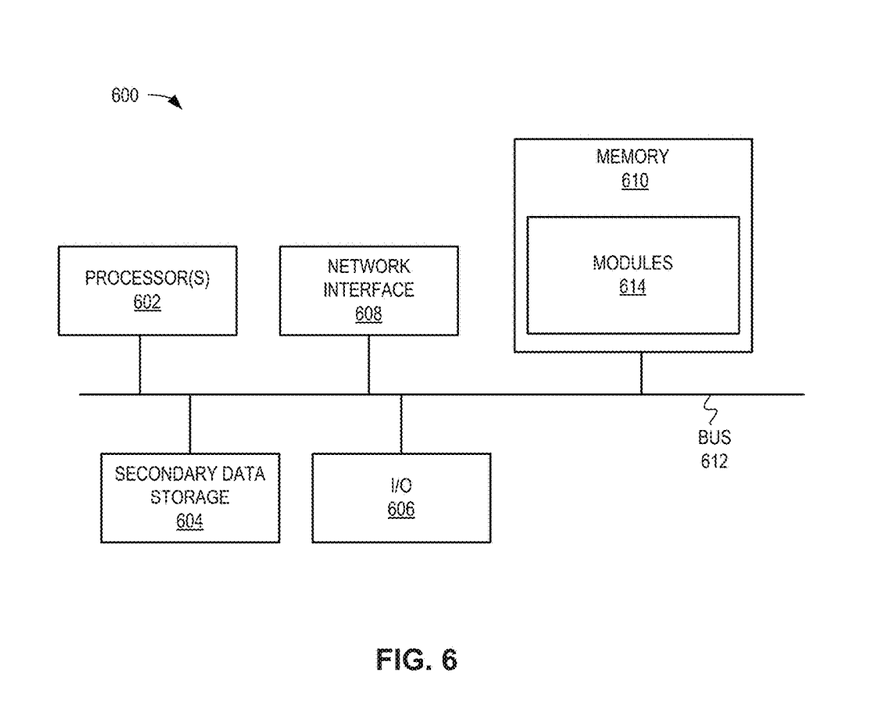
FIG. 6 shows a computer system, according to an example of the present disclosure.

With reference to FIG. 5, there is shown a flow chart of a method 500 for encoding data within a crossbar memory array containing cells, according to an example of the present disclosure. It should be apparent to those of ordinary skill in the art that the method 500 represents a generalized illustration and that other operations may be added or existing operations may be removed, modified or rearranged without departing from the scopes of the method 500. The method 500 may be implemented, for example, by a processor 602 of computing device 600 as depicted in FIG. 6 below.

In FIG. 5, the memory control module 103, for instance, may receive bits of input data 107 to be stored in the cells 102 of the memory array 101, as shown in block 510. According to an example, the cells 102 of the memory array 101 may be memristor devices. As noted above, each memristor device may be capable of switching to an ON state with a low resistance and to an OFF state with a high resistance.

In block 520, the encoder module 104, for instance, may map the bits of input data to the cells in a row of the memory array 101. The cells may be assigned to one of a low resistance state and a high resistance state according to the mapping. Thereafter, when the read/write control module 106, for instance, attempts to access a selected cell in the row, a half-selected cell with a low resistance state (i.e., logical "1" or ON) may have more leakage than a half-selected cell with a high resistance state (i.e., logical "0" or OFF). As mentioned above, the location of a half-selected cell with a low resistance state in relation to the voltage source of the row may significantly impact the access time and voltage drop in the half-selected row.

Thus, according to an example of the present disclosure, the encoder module 104 may minimize the voltage drop due to sneak or leakage current by implementing blocks 530 and 540 of the method 500. In particular, the encoder module 104, for instance, may group a subset of the mapped bits in the row into a word pattern, as shown in block 530. The word pattern, for instance, may be a subset of cells that include all of the cells in the row or a contiguous or non-contiguous portion of the cells located in the row of the memory array 101. The encoder module 104 may group the subset of cells according to any predetermined grouping algorithm.

In block 540, the encoder module 104, for instance, may arrange the word pattern such that more low resistance states are assigned to cells that are located closer to a voltage source of the row of the memory array than to cells that are located farther away from the voltage source. For example, the encoder module 104 may determine that a majority of low resistance states in the word pattern are mapped to cells that are located farthest from a voltage source. That is, a word pattern of '000011' has a majority of low resistance states in a half of the word pattern that is farthest away from the voltage source. On the other hand, the word patterns of '110000' or '110011' do not have a majority of low resistance states in a half of the word pattern that is farthest away from the voltage source. Accordingly, in response to a determination that the majority of low resistance states in the word pattern are located farther from a voltage source, the encoder module 104 may arrange the word pattern such that more low resistance states are mapped to cells that are located closer to the voltage source.

Specifically, the encoder module 104 may flip the word pattern from '000011' to '110000' and the read/write control module 106, for instance, may store the flipped word pattern into corresponding cells in the row of the memory array 101. By flipping the word pattern, the effective voltage drop across the row may be minimized because the majority of low resistance states are now located closer to the voltage source. That is, mapping the logical "1"s closer to the voltage source may lead to a smaller sneak current flowing from the voltage source 320 to the half-selected cells with the low resistance state.

According to an example, the encoder module 104 may flip the word pattern to one of a big endian arrangement and a little endian arrangement. For example, one arrangement may indicate an original order for the word pattern and the other arrangement may indicate that the order is flipped. In addition, the memory control module 103 may store an additional bit in the memory array to indicate whether the word pattern is stored in the big endian arrangement or the little endian arrangement. This additional bit may also, for example, be stored close to the voltage source to further minimize the effective voltage drop across the row. Moreover, the decoder module 105 may decode the word pattern by reverting the word pattern to its original form based on the stored additional bit, which indicates whether the word pattern is stored in the original order or the flipped order.

On the other hand, in response to a determination that the majority of low resistance states in the word pattern are located closer to a voltage source, the encoder module 104 does not need to change or flip the word pattern. In this case, the majority of low resistance states are already located closer to the voltage source, and thus, the effective voltage drop across the row may already be minimized.

5. Computer Readable Medium

FIG. 6 shows a computer system 600 that may be used with the examples described herein. The computer system 600 represents a generic platform that includes components that may be in a server or another computer system. The computer system 600 may be used as a platform for the system 100. The computer system 600 may execute, by a processor 602 or other hardware processing circuit, the methods, functions and other processes described herein. These methods, functions and other processes may be embodied as machine readable instructions stored on computer readable medium, which may be non-transitory, such as hardware storage devices (e.g., RAM (random access memory), ROM (read only memory), EPROM (erasable, programmable ROM), EEPROM (electrically erasable, programmable ROM), hard drives, and flash memory).

The computer system 600 includes a processor 602 that may implement or execute machine readable instructions performing some or all of the methods, functions and other processes described herein. Commands and data from the processor 602 are communicated over a communication bus 612. The computer system 600 also includes a main memory 610, such as a random access memory (RAM), where the machine readable instructions and data for the processor 602 may reside during runtime, and a secondary data storage 604, which may be non-volatile and stores machine readable instructions and data. The secondary data storage 604 may be the same as or similar to the apparatus 100. The memory 610 and the secondary data storage 604 are examples of computer readable mediums. The memory 610 may include modules 614 including machine readable instructions residing in the memory 610 during runtime and executed by the processor 602. The modules 614 may include the modules 103-106 of the apparatus 100 shown in FIG. 1.

The computer system 600 may include an I/O device 606, such as a keyboard, a mouse, a display, etc. The computer system 600 may include a network interface 608 for connecting to a network. Other known electronic components may be added or substituted in the computer system 600.

What has been described and illustrated herein are examples of the disclosure along with some variations. The terms, descriptions and figures used herein are set forth by way of illustration only and are not meant as limitations. Many variations are possible within the scope of the disclosure, which is intended to be defined by the following claims—and their equivalents—in which all terms are meant in their broadest reasonable sense unless otherwise indicated.

What is claimed is:

1. A method for encoding data within a crossbar memory array containing cells, comprising:
   receiving, by a processor, bits of input data;
   mapping, by the processor, the received bits of input data to the cells in a row of the memory array, wherein the cells are to be assigned to one of a low resistance state and a high resistance state according to the mapping;
   grouping, by the processor, a subset of the mapped bits in the row into a word pattern; and
   arranging, by the processor, the mapped bits in the word pattern such that more low resistance states are assigned to cells that are located closer to a voltage source of the row of the memory array than to cells that are located farther away from the voltage source.

2. The method of claim 1, wherein arranging the word pattern includes:
   determining whether a first half of the word pattern located closer to the voltage source has a greater number of low resistance states than a second half of the word pattern located farther from the voltage source,
   in response to a determination that the first half of the word pattern has a greater number of low resistance states than the second half of the word pattern, flipping the word pattern to arrange the mapped bits in the word pattern so that more low resistance states are assigned to cells that are located closer to the voltage source.

3. The method of claim 2, wherein flipping the word pattern further includes storing an additional bit in the memory array to indicate that the word pattern is flipped.

4. The method of claim 3, wherein storing the additional bit in the memory array further includes storing the additional bit close to the voltage source relative to the word pattern.

5. The method of claim 3, further including:
   decoding the word pattern by reverting the word pattern to an original form based on the stored additional bit.

6. The method of claim 1, further including storing the bits of input data into corresponding cells of the memory array according to the arranged word pattern.

7. A data storage apparatus for encoding data within a crossbar memory array containing cells, said data storage apparatus comprising:
a processor;
a memory storing machine readable instructions that are to cause the processor to:
designate bits of input data to the cells in a row of the memory array, wherein the cells are to be assigned to one of a low resistance state and a high resistance state according to the designation;
categorize a portion of the designated bits of input data in the row into a bit pattern; and
arrange the designated bits in the bit pattern such that more low resistance states are assigned to cells that are located closer to a voltage source of the row of the memory array than to cells that are located farther away from the voltage source.

8. The data storage apparatus of claim 7, wherein to arrange the bit pattern, the machine readable instructions are to cause the processor to:
determine whether a first half of the bit pattern located closer to the voltage source has a greater number of low resistance states than a second half of the bit pattern located farther from the voltage source,
in response to a determination that the first half of the bit pattern has a greater number of low resistance states than the second half of the bit pattern, flip the bit pattern to arrange the designated bits in the bit pattern so that more low resistance states are assigned to cells that are located closer to the voltage source.

9. The data storage apparatus of claim 8, wherein to flip the bit pattern, the machine readable instructions are to cause the processor to store an additional bit in the memory array to indicate that the bit pattern is flipped.

10. The data storage apparatus of claim 8, wherein to store the additional bit in the memory array, the machine readable instructions are to cause the processor to store the additional bit close to the voltage source relative to the bit pattern.

11. The data storage apparatus of claim 9, wherein the machine readable instructions are further to cause the processor to decode the bit pattern by reverting the bit pattern to an original form based on the stored additional bit.

12. The data storage apparatus of claim 8, wherein the machine readable instructions are further to cause the processor to store the bits of input data into corresponding cells of the memory array according to the arranged bit pattern.

13. A non-transitory computer readable medium to encode data within a crossbar memory array containing cells, including machine readable instructions executable by a processor to:
receive bits of input data;
map the bits of input data to the cells in a row of the memory array, wherein the cells are assigned to one of a low resistance state and a high resistance state;
group a subset of the mapped bits in the row into a word pattern;
determine whether a majority of low resistance states in the word pattern are mapped to cells that are located farthest away from a voltage source along the row; and
in response to a determination that the majority of low resistance states in the word pattern are mapped to cells located farthest away from the voltage source, flip the word pattern to arrange the mapped bits in the word pattern such that the majority of the low resistance states are mapped to cells that are located closer to the voltage source of the row of the memory array.

14. The non-transitory computer readable medium of claim 13, wherein to flip the word pattern, the machine readable instructions are executable by the processor to store an additional bit in the memory array to indicate that the word pattern has been flipped, wherein the additional bit is stored close to the voltage source relative to the word pattern.

15. The non-transitory computer readable medium of claim 14, wherein the machine readable instructions are executable by the processor to:
store the bits of input data into corresponding cells of the memory array according to the flipped word pattern; and
decode the flipped word pattern by reverting the word pattern to an original form based on the stored additional bit.

* * * * *